(12) United States Patent
Jeong et al.

(10) Patent No.: US 12,448,490 B2
(45) Date of Patent: Oct. 21, 2025

(54) EPOXY RESIN COMPOSITION FOR MOLDING SEMICONDUCTOR, MOLDING FILM AND SEMICONDUCTOR PACKAGE USING THE SAME

(71) Applicant: LG CHEM, LTD., Seoul (KR)

(72) Inventors: Minsu Jeong, Daejeon (KR); You Jin Kyung, Daejeon (KR); Byung Ju Choi, Daejeon (KR); Woo Jae Jeong, Daejeon (KR); Kwang Joo Lee, Daejeon (KR); Eunbyurl Cho, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 18/323,562

(22) Filed: May 25, 2023

(65) Prior Publication Data
US 2023/0295388 A1    Sep. 21, 2023

Related U.S. Application Data

(62) Division of application No. 16/767,808, filed as application No. PCT/KR2019/000353 on Jan. 9, 2019, now Pat. No. 11,702,520.

(30) Foreign Application Priority Data

Jan. 11, 2018 (KR) .................. 10-2018-0004041
Jan. 7, 2019 (KR) .................. 10-2019-0001976

(51) Int. Cl.
*C08J 5/18* (2006.01)
*C08G 59/14* (2006.01)
*C08K 3/36* (2006.01)
*H01L 23/29* (2006.01)

(52) U.S. Cl.
CPC ............... *C08J 5/18* (2013.01); *C08G 59/14* (2013.01); *C08K 3/36* (2013.01); *H01L 23/295* (2013.01); *C08J 2363/00* (2013.01); *C08K 2201/003* (2013.01)

(58) Field of Classification Search
CPC ......... C08J 5/18; C08J 2363/00; C08G 59/14; C08K 3/36; C08K 2201/003
USPC ...................................................... 524/493
See application file for complete search history.

(56) References Cited

U.S. PATENT DOCUMENTS

| 8,470,918 B2 | 6/2013 | Hirose et al. |
| 2005/0163971 A1 | 7/2005 | Kobayashi et al. |
| 2012/0315601 A1 | 12/2012 | Shchori et al. |
| 2013/0026660 A1 | 1/2013 | Czubarow et al. |
| 2016/0024294 A1 | 1/2016 | Tsutsumi et al. |
| 2017/0198182 A1 | 7/2017 | Kim et al. |
| 2017/0233610 A1 | 8/2017 | Kim et al. |
| 2023/0295388 A1 | 9/2023 | Jeong et al. |

FOREIGN PATENT DOCUMENTS

| JP | 2001-207022 A | 7/2001 |
| JP | 2004-083764 A | 3/2004 |
| JP | 2004-339292 A | 12/2004 |
| JP | 2004-354568 A | 12/2004 |
| JP | 2005-171187 A | 6/2005 |
| JP | 2006-008854 A | 1/2006 |
| JP | 2007-031555 A | 2/2007 |
| JP | 4079125 B2 | 4/2008 |
| JP | 2012-077257 A | 4/2012 |
| JP | 2013-209479 A | 10/2013 |
| JP | 2013-210616 A | 10/2013 |
| JP | 2014-008612 A | 1/2014 |
| JP | 2014-156591 A | 8/2014 |
| JP | 2014-219636 A | 11/2014 |
| JP | 2015-060184 A | 3/2015 |
| JP | 2015-082606 A | 4/2015 |
| JP | 2015-152861 A | 8/2015 |
| JP | 2016-027400 A | 2/2016 |
| JP | 2016-108499 A | 6/2016 |
| JP | 2016191031 A * | 11/2016 |
| JP | 2017-171696 A | 9/2017 |
| JP | 7556506 B2 | 9/2024 |
| KR | 10-2008-0049087 A | 6/2008 |
| KR | 10-2013-0118298 A | 10/2013 |
| KR | 10-2014-0064820 A | 5/2014 |
| KR | 10-2016-0128936 A | 11/2016 |
| TW | 201217421 A | 5/2012 |
| WO | 2011-105192 A1 | 9/2011 |
| WO | 2017-183226 A1 | 10/2017 |

OTHER PUBLICATIONS

Search Report issued for corresponding International Application No. PCT/KR2019/000353 on Apr. 30, 2019, 4 pages.
Extended European Search Report dated Nov. 17, 2020, of the corresponding European Patent Application No. 19738837.4, 6 pages.

* cited by examiner

*Primary Examiner* — Kelechi C Egwim
(74) *Attorney, Agent, or Firm* — ROTHWELL, FIGG, ERNST & MANBECK, P.C.

(57) ABSTRACT

The present invention relates to an epoxy resin composition for molding a semiconductor having excellent heat resistance and mechanical properties and also having improved visibility while having a low coefficient of thermal expansion and thus exhibiting improved warpage characteristics, and a molding film and a semiconductor package using such an epoxy resin composition for molding a semiconductor.

4 Claims, No Drawings

EPOXY RESIN COMPOSITION FOR MOLDING SEMICONDUCTOR, MOLDING FILM AND SEMICONDUCTOR PACKAGE USING THE SAME

CROSS-REFERENCE TO RELATED APPLICATION(S)

This application is a divisional of U.S. application Ser. No. 16/767,808 filed on May 28, 2020, which is 35 U.S.C. 371 National Phase Entry Application from PCT/KR2019/000353 filed on Jan. 9, 2019, designating the United States and which claims the benefits of filing dates of Korean Patent Application No. 10-2018-0004041 filed on Jan. 11, 2018, and Korean Patent Application No. 10-2019-0001976 filed on Jan. 7, 2019, the entire contents of which are incorporated herein by reference.

TECHNICAL FIELD

The present invention relates to an epoxy resin composition for molding a semiconductor, a molding film, and a semiconductor package using the same. More specifically, the present invention relates to an epoxy resin composition for molding a semiconductor having excellent heat resistance and mechanical properties and also having improved visibility while having a low coefficient of thermal expansion and thus exhibiting improved warpage characteristics, and a molding film and a semiconductor package using such an epoxy resin composition for molding a semiconductor.

BACKGROUND OF THE INVENTION

Semiconductor chip fabrication processes generally include a micropattern-forming process on a wafer, and a packaging process wherein a wafer is ground to the size of a final device.

The packaging process includes: a wafer testing process during which defective semiconductor chips are inspected; a dicing process in which a wafer is cut into individual chips; a die bonding process wherein the separate chips are attached to a mounting board of a circuit film or lead frame; a wire bonding process wherein a chip pad provided on a semiconductor chip is connected with a circuit pattern of the circuit film or lead frame via electrical connecting means such as wires; a molding process wherein the exterior of the semiconductor is wrapped with an enveloping material in order to protect the internal circuit and other parts of the semiconductor chip; a trimming process wherein a dam bar connecting leads is broken; a forming process wherein the leads are bent to obtain a desired form; and a final product testing process to inspect for defects in a packaged product.

In particular, the molding process is indispensable for preventing internal circuits and other parts of the semiconductor chip from being exposed to the outside and thus drastically degrading the performance thereof due to moisture, impact, heat, and the like.

However, in recent years, with a tendency towards miniaturization, weight reduction, and higher functionality of electronic equipment, semiconductor packages are being made smaller, lighter, and thinner. Accordingly, in the process of manufacturing thin semiconductor packages as compared with the conventional semiconductor packaging process, there is a problem in that the package is bent due to heat shrinkage, curing shrinkage, or the like of the epoxy resin composition in the molding process.

In order to solve these problems, attempts have been made to improve the warpage characteristics by adding a large amount of inorganic filler to the epoxy resin used in the molding process, and thus narrowing a difference between the coefficient of thermal expansion of the epoxy resin composition and the coefficient of thermal expansion between the semiconductor chips.

However, as an excess amount of inorganic filler is added in this way, there has been a limitation in that visibility is reduced even though no additional pigment or dye is added in the finally manufactured semiconductor package.

In this regard, there is a demand for development of an epoxy resin composition for molding a semiconductor which has improved visibility while having a low coefficient of thermal expansion, and thus exhibiting improved warpage characteristics.

DETAILED DESCRIPTION OF THE INVENTION

The present invention provides an epoxy resin composition for molding a semiconductor having excellent heat resistance and mechanical properties and also having improved visibility while having a low coefficient of thermal expansion, and thus exhibiting improved warpage characteristics.

The present invention also provides a molding film obtained using the aforementioned epoxy resin composition for molding a semiconductor.

The present invention further provides a semiconductor package sealed with the molding film.

The present invention provides an epoxy resin composition for molding a semiconductor, including: an epoxy resin containing an epoxy polymer represented by the following Chemical Formula 1 and an epoxy compound represented by the following Chemical Formula 2; and 50% by weight or more and 90% by weight or less of an inorganic filler.

[Chemical Formula 1]

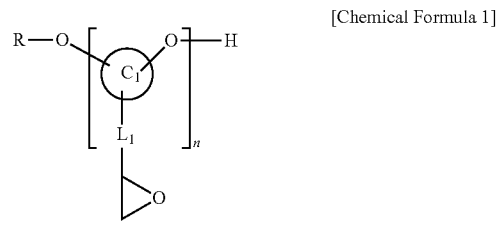

In Chemical Formula 1, R is an alkyl group having 1 to 20 carbon atoms, or a cycloalkyl group having 3 to 20 carbon atoms, n is an integer from 1 to 30, $C_1$ is a cycloalkane having 3 to 10 carbon atoms, $L_1$ is a direct bond or an alkylene group having 1 to 10 carbon atoms.

[Chemical Formula 2]

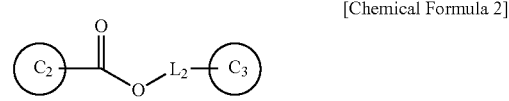

In Chemical Formula 2, $C_2$ to $C_3$ are each independently a cycloalkane having 3 to 10 carbon atoms to which an epoxy group is bonded, and $L_2$ is a direct bond or an alkylene group having 1 to 10 carbon atoms.

The present invention also provides a molding film including a polymer containing a repeating unit represented by the following Chemical Formula 3 and a repeating unit represented by the following Chemical Formula 4, and 50% by weight or more and 90% by weight or less of an inorganic filler dispersed in the polymer.

[Chemical Formula 3]

[Chemical Formula 4]

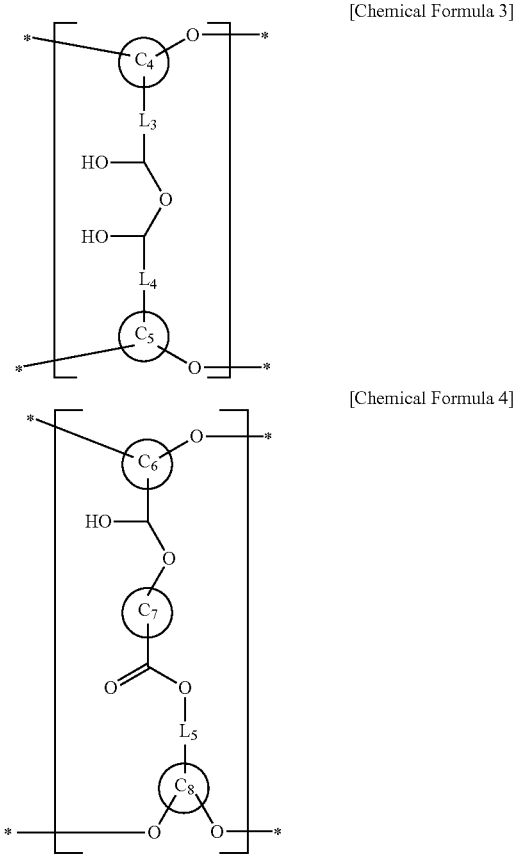

In Chemical Formulas 3 and 4, $C_4$ to $C_8$ are each independently a cycloalkane having 3 to 10 carbon atoms, and $L_3$ to $L_5$ are each independently a direct bond or an alkylene group having 1 to 10 carbon atoms.

In addition, the present invention provides a semiconductor package including a semiconductor sealed with a molding film of another embodiment described above.

Hereinafter, an epoxy resin composition for molding a semiconductor, a molding film, and a semiconductor package using the same according to specific embodiments of the present invention will be described in more detail.

Throughout the specification, when one part "includes" one constituent element, unless otherwise specifically described, this does not mean that another constituent element is excluded, but means that another constituent element may be further included.

As used herein, the weight average molecular weight means a weight average molecular weight in terms of polystyrene measured by the GPC method. In the process of determining the weight average molecular weight in terms of polystyrene measured by the GPC method, a commonly known analyzing device, a detector such as a refractive index detector, and an analytical column can be used. Commonly applied conditions for temperature, solvent, and flow rate can be used. Specific examples of the measurement conditions are as follows: a Polymer Laboratories PLgel MIX-B, 300 mm column, Waters PL-GPC220 instrument is used at an evaluation temperature of 160° C., 1,2,4-trichlorobenzene is used as a solvent, the flow rate is 1 mL/min, a sample is prepared at a concentration of 10 mg/10 mL and then fed in an amount of 200 μL, and the value of Mw can be determined using calibration curves formed from a polystyrene standard. The molecular weight of the polystyrene standards is nine kinds of 2000/10,000/30,000/70,000/200,000/700,000/2,000,000/4,000,000/10,000,000.

As used herein, the notation ⊥ or ----- means a bond linked to another substituent group, and the direct bond means the case where no other atoms exist in the parts represented as L.

In the present specification, the alkyl group may be a straight chain or a branched chain. The number of carbon atoms thereof is not particularly limited, but is preferably 1 to 40. According to one embodiment, the number of carbon atoms of the alkyl group is 1 to 20. According to another embodiment, the number of carbon atoms of the alkyl group is 1 to 10. According to a further embodiment, the number of carbon atoms of the alkyl group is 1 to 6. Specific examples of the alkyl group include methyl, ethyl, propyl, n-propyl, isopropyl, butyl, n-butyl, isobutyl, tert-butyl, sec-butyl, 1-methyl-butyl, 1-ethyl-butyl, pentyl, n-pentyl, isopentyl, neopentyl, tert-pentyl, hexyl, n-hexyl, 1-methylpentyl, 2-methylpentyl, 4-methyl-2-pentyl, 3,3-dimethylbutyl, 2-ethylbutyl, heptyl, n-heptyl, 1-methylhexyl, cyclopentyl methyl, cycloheptyl methyl, octyl, n-octyl, tert-octyl, 1-methylheptyl, 2-ethylhexyl, 2-propylpentyl, n-nonyl, 2,2-dimethylheptyl, 1-ethyl-propyl, 1,1-dimethyl-propyl, isohexyl, 2-methylpentyl, 4-methylhexyl, 5-methylhexyl, and the like, but are not limited thereto.

In the present specification, the cycloalkyl group is not particularly limited, but the number of carbon atoms thereof is 3 to 60. According to one embodiment, the cycloalkyl group has 3 to 30 carbon atoms. According to another embodiment, the cycloalkyl group has 3 to 20 carbon atoms. According to a further embodiment, the cycloalkyl group has 3 to 6 carbon atoms. Specific examples thereof include cyclopropyl, cyclobutyl, cyclopentyl, 3-methylcyclopentyl, 2,3-dimethylcyclopentyl, cyclohexyl, 3-methylcyclohexyl, 4-methylcyclohexyl, 2,3-dimethylcyclohexyl, 3,4,5-trimethylcyclohexyl, 4-tert-butylcyclohexyl, cycloheptyl, cyclooctyl, and the like, but are not limited thereto.

In the present specification, the aryl group is not particularly limited, but preferably has 6 to 60 carbon atoms, and may be a monocyclic aryl group or a polycyclic aryl group. According to one embodiment, the aryl group has 6 to 30 carbon atoms. According to another embodiment, the aryl group has 6 to 20 carbon atoms. The monocyclic aryl group may include, but is not limited to, a phenyl group, a biphenyl group, a terphenyl group, or the like. The polycyclic aryl group may include, but is not limited to, a naphthyl group, an anthracenyl group, a phenanthryl group, a pyrenyl group, a perylenyl group, a chrycenyl group, a fluorenyl group, or the like.

In the present specification, the cycloalkane is a cyclic hydrocarbon having the molecular formula $C_nH_{2n}$, wherein the carbon number n may be 3 to 20, 3 to 10, 4 to 8, or 5 to 6. Specific examples thereof include cyclopropane, cyclobutane, cyclopentane, cyclohexane, cycloheptane, cyclooctane, and the like.

In the present specification, the alkylene group is a bivalent functional group derived from alkane. For example, the alkylene group is a straight chain or a branched chain, which may include a methylene group, an ethylene group, a propylene group, an isobutylene group, a sec-butylene group, a tert-butylene group, a pentylene group, a hexylene group, or the like.

In the present specification, the "adjacent" group may mean a substituent substituted with an atom directly linked to an atom in which the corresponding substituent is substituted, a substituent disposed sterically closest to the corresponding substituent, or another substituent substituted with an atom in which the corresponding substituent is substituted. For example, two substituents substituted at the ortho position in a benzene ring and two substituents substituted with the same carbon in an aliphatic ring may be interpreted as groups which are "adjacent" to each other.

1. Epoxy Resin Composition for Molding Semiconductor

According to one embodiment of the invention, an epoxy resin composition for molding a semiconductor can be provided, including: an epoxy resin containing an epoxy polymer represented by Chemical Formula 1 and an epoxy compound represented by Chemical Formula 2; and 50% by weight or more and 90% by weight or less of an inorganic filler.

The present inventors found the limitation that the visibility deteriorates in conventional epoxy resin compositions for molding a semiconductor containing an excessive amount of inorganic filler together with an epoxy resin, and developed a method of introducing a new epoxy resin containing an epoxy polymer represented by Chemical Formula 1 and an epoxy compound represented by Chemical Formula 2 in order to solve this problem. The inventors found through experiments that in the case of a molding film obtained from a composition containing 50% by weight or more and 90% by weight or less of an inorganic filler together with a new epoxy resin containing a specific structure represented by Chemical Formulas 1 and 2 as described above, it is possible to simultaneously realize the effects of improving the mechanical properties, heat resistance, and warpage characteristics by adding an excess amount of the inorganic filler while increasing transparency and having excellent visibility, thereby completing the present invention.

In the epoxy resin, since an epoxy polymer of Chemical Formula 1 having excellent heat resistance and modulus, and an epoxy compound of Chemical Formula 2 existing in a liquid state at room temperature and thus being advantageous for containing a high content of inorganic filler, are mixed, the solubility of the inorganic filler is improved due to the liquid epoxy compound, thereby suppressing the phenomenon where the inorganic filler is eluted to the epoxy resin surface and the visibility is reduced. Also, the heat resistance, mechanical properties, and warpage characteristics are greatly improved through the polymerized epoxy structure, and two different materials can be evenly distributed to exhibit uniform physical properties as a whole.

Unlike ordinary epoxy resins, the epoxy resin does not contain an unsaturated aliphatic functional group but contains a cyclic aliphatic functional group. Therefore, the epoxy resin can have a refractive index which is very similar to the refractive index of the silica filler itself used as an inorganic filler, thereby realizing uniformly high transmittance in the molding film.

In particular, when the molding process of a semiconductor chip is carried out using an epoxy resin composition containing a high content of an inorganic filler together with the epoxy resin, the warpage characteristics of the semiconductor chip and the circuit board are minimized inside the molded semiconductor package in which molding is completed, and the durability of the thin semiconductor package can be improved. Moreover, the heat resistance and mechanical properties of the external molded film of the semiconductor package are improved and the performance as a protective film of the semiconductor package can be improved. Further, since the solubility of the inorganic filler can be increased and the visibility can be improved, it is possible to easily catch the defects of the semiconductor chip and the circuit board inside the semiconductor package. In addition, by blending pigments, dyes, and the like, the target color can be clearly achieved.

The details of each component of the epoxy resin composition for a semiconductor will be described below.

(1) Epoxy Resin

The epoxy resin is a binder resin which is a thermosetting resin that can be thermally cured through an epoxy curing agent or the like which is further applied to an epoxy resin composition.

In Chemical Formula 1, R is an alkyl group having 1 to 20 carbon atoms or a cycloalkyl group having 3 to 20 carbon atoms, n is an integer from 1 to 30, $C_1$ is a cycloalkane having 3 to 10 carbon atoms, and $L_1$ is a direct bond or an alkylene group having 1 to 10 carbon atoms.

In particular, the epoxy polymer represented by Chemical Formula 1 has a structure in which an epoxy functional group is bonded to a cycloalkane having 3 to 10 carbon atoms represented by $C_1$, and due to the chemical structural characteristic that the double bond in the molecule is not contained at all, the epoxy resin can have high weather resistance and transparency.

Specifically, the epoxy polymer represented by Chemical Formula 1 does not contain a general unsaturated aliphatic functional group but contains a cyclic aliphatic functional group, and the epoxy resin synthesized therefrom can have a refractive index which is very similar to the refractive index of the silica filler itself used as the inorganic filler, thereby realizing uniformly high transmittance in the molding film.

On the other hand, as the bisphenol-based epoxy polymer, which is an epoxy polymer used in conventional molding films, contains double bonds in the molecule, it exhibits relatively low weather resistance and transparency.

Furthermore, the epoxy polymer represented by Chemical Formula 1 has a low viscosity characteristic and thus is extremely advantageous for adding an excess amount of a filler. As the synthesis of the polymer proceeds to the oxidation reaction of the double bond of cycloalkyne, it is possible to provide the effect that ionic impurities (e.g., chloride ions) in the finally synthesized epoxy polymer may be remarkably reduced as compared with a general bisphenol-based epoxy polymer synthesis process.

On the other hand, in Chemical Formula 2, $C_2$ to $C_3$ are each independently a cycloalkane having 3 to 10 carbon atoms to which an epoxy group is bonded, and $L_2$ is a direct bond or an alkylene group having 1 to 10 carbon atoms.

In Chemical Formula 2, in the cycloalkane having 3 to 10 carbon atoms to which an epoxy group is bonded, the epoxy group can be bonded through two adjacent carbon atoms of cycloalkane having 3 to 10 carbon atoms.

Preferably, in Chemical Formula 1, R is an alkyl group having 1 to 20 carbon atoms or a cycloalkyl group having 3 to 20 carbon atoms, n is an integer of 1 to 20, $C_1$ is a cyclohexane having 6 carbon atoms, and $L_1$ may be a direct bond.

Specifically, Chemical Formula 1 may be represented by the following Chemical Formula 1-1.

[Chemical Formula 1-1]

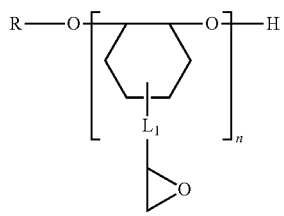

In Chemical Formula 1-1, the definitions of R, n, and $L_1$ are the same as those described above in Chemical Formula 1.

Further, in Chemical Formula 2, preferably, $C_2$ to $C_3$ are each independently a cyclohexane having 6 carbon atoms to which an epoxy group is bonded, and $L_2$ is an alkylene group having 1 to 5 carbon atoms (e.g., a methylene group having 1 carbon atom).

The epoxy compound represented by Chemical Formula 2 does not contain a general unsaturated aliphatic functional group but contains a cyclic aliphatic functional group, and the epoxy resin synthesized therefrom can have a refractive index that is very similar to the refractive index of the silica filler itself used as the inorganic filler, thereby realizing uniformly high transmittance in the molding film.

Specifically, the Chemical Formula 2 may be represented by the following Chemical Formula 2-1.

[Chemical Formula 2-1]

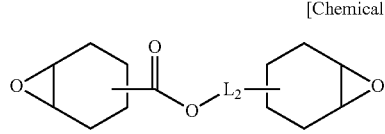

In Chemical Formula 2-1, the definitions of $L_2$ are the same as those described above in Chemical Formula 2.

The epoxy polymer represented by Chemical Formula 1 may have a weight average molecular weight (measured by GPC) of 100 g/mol or more and 5000 g/mol or less. Due to the epoxy polymer represented by Chemical Formula 1, the transparency, heat resistance, and modulus of the epoxy resin, which is the reaction product to be produced, can be improved, and the low viscosity makes it possible to increase the dispersibility of the high content of inorganic filler.

The epoxy compound represented by Chemical Formula 2 may exist in a liquid state at room temperature (20° C. to 30° C.), and thus the epoxy resin, which is the reaction product to be produced, may contain a high content of inorganic filler.

On the other hand, the epoxy compound represented by Chemical Formula 2 may be contained in an amount of 50 parts by weight or more and 90 parts by weight or less, 60 parts by weight or more and 85 parts by weight or less, or 65 parts by weight or more and 85 parts by weight or less, based on 100 parts by weight of the epoxy polymer represented by Chemical Formula 1. When the epoxy compound represented by Chemical Formula 2 is excessively reduced, the epoxy resin to be produced can not sufficiently contain the inorganic filler in a high content, so that the mechanical properties and warpage characteristics of the molding film may deteriorate, and when the epoxy compound represented by Chemical Formula 2 is excessively increased, the heat resistance and mechanical properties of the final molding film may be reduced.

On the other hand, the epoxy resin can be contained in an amount of 5% by weight or more and 40% by weight or less, 5% by weight or more and 30% by weight or less, or 5% by weight or more and 25% by weight or less, based on the total weight of the epoxy resin composition.

(2) Inorganic Filler

The epoxy resin composition for molding a semiconductor may contain 50% by weight or more and 90% by weight or less, 60% by weight or more and 80% by weight or less, or 70% by weight or more and 90% by weight or less of an inorganic filler, based on the total weight of the epoxy resin composition. Specifically, the inorganic filler may be contained in an amount of 200 parts by weight or more and 1000 parts by weight or less, or 220 parts by weight or more and 700 parts by weight or less, or 230 parts by weight or more and 620 parts by weight or less, based on 100 parts by weight of the epoxy resin. In this way, by adding the inorganic filler in a high content, the coefficient of thermal expansion of the molding film obtained from the epoxy resin composition for molding a semiconductor is lowered, and thus the difference in coefficient of thermal expansion between semiconductor chips is reduced, the extent of warpage of the semiconductor package finally produced can be reduced, and the mechanical properties of the molding film can be improved.

The inorganic filler can be added for improving the handleability, heat resistance, and thermal conductivity of the composition, and for adjusting the melt viscosity and the like. Examples thereof include silicon dioxide, titanium dioxide, aluminum hydroxide, calcium carbonate, magnesium hydroxide, aluminum oxide, talc, aluminum nitride, or a mixture of two or more thereof, but are not limited thereto.

However, silica can be preferably used as the inorganic filler. In particular, as the silica, silica having an average particle diameter of 100 μm or less, 10 μm or less, 0.1 μm or more and 100 μm or less, or 0.1 μm or more and 10 μm or less, can be used.

The average particle diameter of the silica can be determined by checking the particle diameter of all the silica, and the particle diameter of the silica can be confirmed on the cross-section of a molding film described later. Further, the average particle diameter of the silica can be confirmed through the particle diameters of all the silica used in the production of the molding film or the average particle diameter thereof.

The silica may be a group of individual particles having an average particle diameter of 100 μm or less, 10 μm or less, 0.1 μm or more and 100 μm or less, or 0.1 μm or more and 10 μm or less. The individual fine particles contained in this group may have an average particle diameter of 100 μm or less, 10 μm or less, 0.1 μm or more and 100 μm or less, or 0.1 μm or more and 10 μm or less. More specifically, 95% to 99% of the individual fine particles contained in the group have a particle diameter of 100 μm or less, 10 μm or less, 0.1 μm or more and 100 μm or less, or 0.1 μm or more and 10 μm or less.

(3) Epoxy Resin Composition

The epoxy resin composition includes the above-mentioned epoxy resin and inorganic filler, and examples of a method for producing the same are not particularly limited.

A method of mixing the epoxy resin and the inorganic filler by various methods, for example using a mixer or the like, can be used.

Further, the epoxy resin composition may contain a heat curing catalyst, an epoxy curing agent, a leveling agent, a dispersant, or a solvent, if necessary.

In addition, the heat curing catalyst serves to accelerate the curing of the heat-curable binder resin during heat-curing. The heat curing catalyst that can be added is not particularly limited, but examples thereof may include imidazole compounds such as imidazole, 2-methylimidazole, 2-ethylimidazole, 2-ethyl-4-methylimidazole, 2-phenylimidazole, 4-phenylimidazole, 1-cyanoethyl-2-phenylimidazole, and 1-(2-cyanoethyl)-2-ethyl-4-methylimidazole; amine compounds such as dicyandiamide, benzyldimethylamine, 4-(dimethylamino)-N,N-dimethylbenzylamine, 4-methoxy-N,N-dimethylbenzylamine, and 4-methyl-N,N-dimethylbenzylamine; hydrazine compounds such as adipic acid dihydrazide and sebacic acid dihydrazide; phosphorus compounds such as triphenylphosphine; and the like.

Furthermore, examples of commercially available products may include 2MZ-A, 2MZ-OK, 2PHZ, 2P4BHZ, and 2P4 MHZ manufactured by Shikoku Chemical Corporation (all are trade names of imidazole compounds); U-CAT3503N and U-CAT3502T manufactured by San-Apro Ltd. (both are trade names of block isocyanate compounds of dimethylamine); DBU, DBN, U-CATSA102, and U-CAT5002 (all are bicyclic amidine compounds and salts thereof); and the like.

However, the usable heat curing catalysts are not limited to examples described above, and compounds known as heat curing catalysts of epoxy resins or oxetane compounds, or heat curing catalysts promoting the reaction between epoxy groups and/or oxetanyl groups and carboxyl groups, can be used without particular limitation.

Furthermore, guanamine, acetoguanamine, benzoguanamine, melamine, and S-triazine derivatives such as 2,4-diamino-6-methacryloyloxyethyl-S-triazine, 2-vinyl-4,6-diamino-S-triazine, 2-vinyl-4,6-diamino-S-triazine-isocyanuric acid adducts, and 2,4-diamino-6-methacryloyloxyethyl-S-triazine-isocyanuric acid adducts can also be used.

The heat curing catalyst may be used in an appropriate amount in consideration of the degree of curing of the epoxy resin. For example, the epoxy resin composition may contain 0.1% by weight or more and 20% by weight or less, or 0.1% by weight or more and 10% by weight or less, of the heat curing catalyst.

Types of the epoxy curing agent may include an amine compound, an acid anhydride compound, an amide compound, a phenol compound, or the like. The amine compound may include diaminodiphenylmethane, diethylenetriamine, triethylenetetramine, diaminodiphenyl sulfone, isophorondiamine, and the like. The acid anhydride compound may include phthalic anhydride, trimellitic anhydride, pyromellitic anhydride, maleic anhydride, tetrahydrophthalic anhydride, methyltetrahydrophthalic anhydride, methylnadic anhydride, hexahydrophthalic anhydride, methylhexahydrophthalic anhydride, and the like. The amide compound may include dicyandiamide and a polyamide resin synthesized from a dimer of linoleic acid and ethylene diamine. The phenol compound may include polyhydric phenols such as bisphenol A, bisphenol F, bisphenol S, fluorene bisphenol, and terpene diphenol; a phenol resin prepared from the condensation of phenols and aldehydes, ketones, or dienes; modified products of phenols and/or phenol resins; halogenated phenols such as tetrabromo bisphenol A and brominated phenol resin; and other imidazoles, BF3-amine complexes, and guanidine derivatives.

The epoxy curing agent can be used in an appropriate amount in consideration of the mechanical properties of the molding film as prepared. For example, the epoxy resin film can include the epoxy curing agent in an amount of 0.01% by weight or more and 10% by weight or less, or 0.1% by weight or more and 5% by weight or less.

The solvent can be used for the purpose of dissolving the epoxy resin composition and imparting suitable viscosity for the application of the composition. As specific examples of the solvent, ketones such as methylethylketone, cyclohexanone, and the like; aromatic hydrocarbons such as toluene, xylene, tetramethylbenzene, and the like; glycol ethers (Cellosolves) such as ethylene glycol monoethyl ether, ethylene glycol monomethyl ether, ethylene glycol monobutylether, diethylene glycol monoethyl ether, diethylene glycol monomethyl ether, diethylene glycol monobutylether, propylene glycol monomethyl ether, propylene glycol monoethyl ether, dipropylene glycol diethylether, triethylene glycol monoethyl ether, and the like; acetic acid esters such as ethyl acetate, butyl acetate, ethylene glycol monoethyl ether acetate, ethylene glycol monobutylether acetate, diethylene glycol monoethyl ether acetate, dipropylene glycol monomethyl ether acetate, and the like; alcohols such as ethanol, propanol, ethylene glycol, propylene glycol, carbitol, and the like; aliphatic hydrocarbons such as octane, decane, and the like; petroleum solvents such as petroleum ether, petroleum naphtha, hydrogenated petroleum naphtha, solvent naphtha, and the like; and amides such as dimethyl acetamide, dimethylformamide (DMF), and the like; may be mentioned. These solvents may be used alone or in combination of two or more thereof.

The solvent may be used in an appropriate amount in consideration of the dispersibility, the solubility, or the viscosity of the epoxy resin composition. For example, the epoxy resin composition can include the solvent in an amount of 0.1% by weight or more and 50% by weight or less, or 1% by weight or more and 30% by weight or less. When the amount of the solvent is too small, it may increase the viscosity of the epoxy resin composition, leading to a lowered coating ability. When the amount of the solvent is too large, it may cause difficulties in a solvent drying process, leading to increased tackiness of the formed film.

2. Molding Film for Molding a Semiconductor

According to another embodiment of the invention, a molding film including a polymer containing a repeating unit represented by Chemical Formula 3 and a repeating unit represented by Chemical Formula 4, and 50% by weight or more and 90% by weight or less of an inorganic filler dispersed in the polymer, can be provided.

The details of the inorganic filler contained in the molding film of the other embodiment includes those described above in the epoxy resin composition for molding a semiconductor of the one embodiment.

The polymer may include all of the repeating units represented by Chemical Formulas 3 and 4, and may include a cured product of the epoxy resin of one embodiment. Thus, physical properties realized from each of the two repeating units can be uniformly realized throughout the film.

Specifically, in the repeating unit represented by Chemical Formula 3 contained in the polymer, $C_4$ to $C_5$ are each independently a cycloalkane having 3 to 10 carbon atoms, and $L_3$ to $L_4$ are each independently a direct bond or an alkylene group having 1 to 10 carbon atoms.

As described above, the repeating unit represented by Chemical Formula 3 contained in the polymer does not contain an unsaturated aliphatic functional group but contains a cyclic aliphatic functional group, and the epoxy polymer containing the same can have a refractive index which is very similar to the refractive index of the silica filler itself used as the inorganic filler, thereby realizing uniformly high transmittance in the molding film.

Preferably, in the repeating unit represented by Chemical Formula 3 contained in the polymer, $C_4$ to $C_5$ are each independently a cyclohexane having 6 carbon atoms, $L_3$ is a direct bond, and $L_4$ is an alkylene group having 1 to 5 carbon atoms (e.g., a methylene group having 1 carbon atom).

The repeating unit represented by Chemical Formula 3 may more specifically be a repeating unit represented by the following Chemical Formula 3-1.

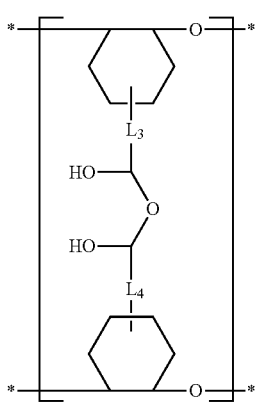

[Chemical Formula 3-1]

In Chemical Formula 3-1, the definitions of $L_3$ to $L_4$ may be the same as those described above in Chemical Formula 3.

The repeating unit represented by Chemical Formula 3 contained in the polymer contained in the molding film can be obtained by an epoxy crosslinking reaction of the epoxy polymer represented by Chemical Formula 1, and the heat resistance and mechanical properties can be improved through the crosslinked structure formed by the repeating unit represented by Chemical Formula 3.

On the other hand, in the repeating unit represented by Chemical Formula 4, $C_6$ to $C_8$ are each independently a cycloalkane having 3 to 10 carbon atoms, and $L_5$ is a direct bond or an alkylene group having 1 to 10 carbon atoms.

Preferably, in the repeating unit represented by Chemical Formula 4 contained in the polymer, $C_6$ to $C_8$ are each independently a cyclohexane having 6 carbon atoms, and $L_5$ is an alkylene group having 1 to 5 carbon atoms (e.g., a methylene group having 1 carbon atom).

As described above, the repeating unit represented by Chemical Formula 4 contained in the polymer does not contain an unsaturated aliphatic functional group but contains a cyclic aliphatic functional group, and the epoxy polymer containing the same can have a refractive index which is very similar to the refractive index of the silica filler itself used as the inorganic filler, thereby realizing uniformly high transmittance in the molding film.

The repeating unit represented by Chemical Formula 4 contained in the polymer may more specifically be a repeating unit represented by the following Chemical Formula 4-1.

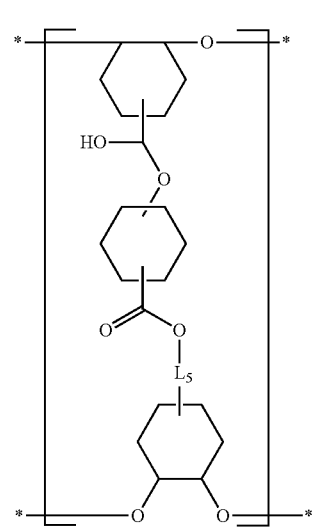

[Chemical Formula 4-1]

In Chemical Formula 4-1, the definitions of $L_5$ may be the same as those described in Chemical Formula 4.

The repeating unit represented by Chemical Formula 4 contained in the polymer contained in the molding film can be obtained by an epoxy crosslinking reaction between the epoxy polymer represented by Chemical Formula 1 and the epoxy compound represented by Chemical Formula 2, and through the crosslinking structure formed by the repeating unit represented by Chemical Formula 4, solubility in a high amount of the inorganic filler can be increased and thus the visibility can be improved.

On the other hand, the polymer included in the molding film may further include a repeating unit represented by the following Chemical Formula 5.

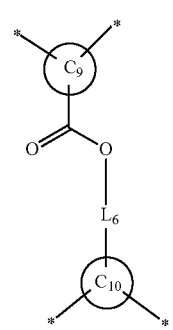

[Chemical Formula 5]

In Chemical Formula 5, $C_9$ and $C_{10}$ are each independently a cycloalkane having 3 to 10 carbon atoms, and $L_6$ is a direct bond or an alkylene group having 1 to 10 carbon atoms.

Preferably, in the repeating unit represented by Chemical Formula 5 contained in the molding film, $C_9$ and $C_{10}$ are each independently a cyclohexane having 6 carbon atoms, and $L_6$ is an alkylene group having 1 to 5 carbon atoms (e.g., a methylene group having 1 carbon atom).

The repeating unit represented by Chemical Formula 5 may more specifically be a repeating unit represented by the following Chemical Formula 5-1.

[Chemical Formula 5-1]

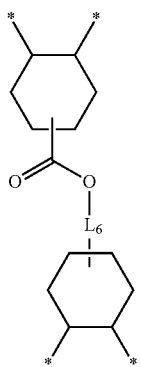

In Chemical Formula 5-1, the definitions of $L_6$ may be the same as those described above in Chemical Formula 5.

When the polymer contained in the molding film further contains the repeating unit represented by Chemical Formula 5 together with the repeating units represented by Chemical Formulas 3 and 4, the repeating unit represented by Chemical Formula 4 may be crosslinked via the repeating unit represented by Chemical Formula 5. Specifically, at least two repeating units represented by Chemical Formula 4 can be crosslinked via the repeating units represented by Chemical Formula 5.

As such, as crosslinking between the repeating units existing therein is formed, the polymer may have excellent heat resistance and mechanical properties, and the coefficient of thermal expansion is low and thus an improved warpage characteristic can be realized.

More specifically, the structure in which the repeating unit represented by Chemical Formula 4 is crosslinked via the repeating unit represented by Chemical Formula 5 may be represented by the following Chemical Formula 6.

[Chemical Formula 6]

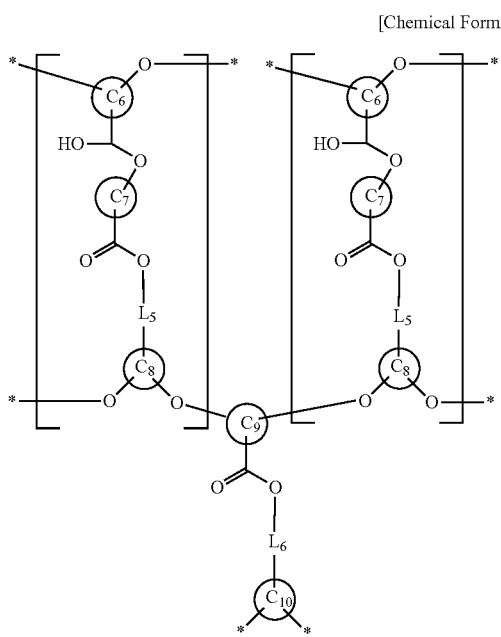

In Chemical Formula 6, $C_6$ to $C_{10}$ are each independently a cycloalkane having 3 to 10 carbon atoms, and $L_5$ and $L_6$ are each independently a direct bond or an alkylene group having 1 to 10 carbon atoms. The definitions of $C_6$ to $C_{10}$ and $L_5$ and $L_6$ may be the same as those described above in Chemical Formulas 3 to 5.

More specifically, the repeating unit represented by Chemical Formula 6 may be represented by the following Chemical Formula 6-1.

[Chemical Formula 6-1]

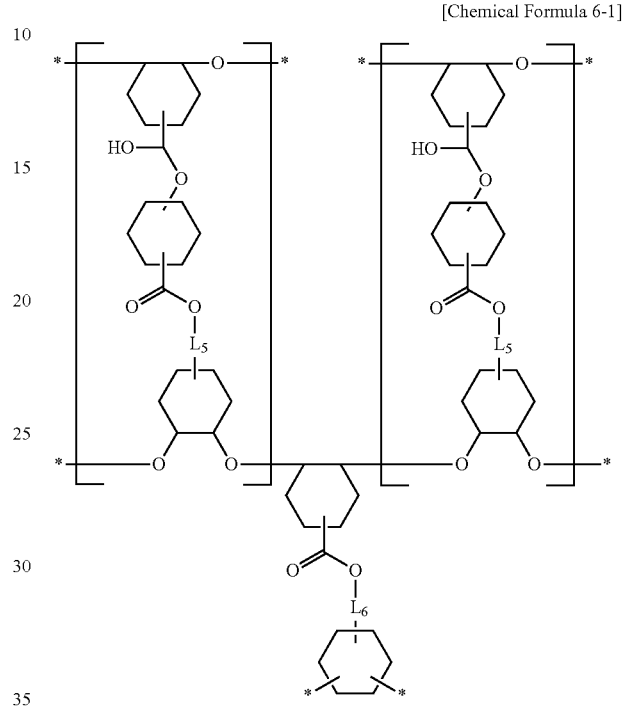

In Chemical Formula 6-1, the definitions of $L_5$ and $L_6$ may be the same as those described above in Chemical Formulas 3 to 5.

Meanwhile, the polymer may include a reaction product between the epoxy polymer represented by Chemical Formula 1 and the epoxy compound represented by Chemical Formula 2 in one embodiment. The details of the epoxy polymer represented by Chemical Formula 1 and the epoxy compound represented by Chemical Formula 2 include those described above in the one embodiment.

That is, the molding film of another embodiment means a fully cured film obtained through the coating, drying, and curing of an epoxy resin composition for molding a semiconductor of the above embodiment, and the polymer contained in the molding film may include a reaction product obtained through an epoxy crosslinking reaction of an epoxy polymer and an epoxy compound contained in an epoxy resin composition for molding a semiconductor.

In the coating step, conventional methods and devices known to be usable for applying the resin composition can be used. For example, a comma coater, a blade coater, a lip coater, a rod coater, a squeeze coater, a reverse coater, a transfer roll coater, a gravure coater, a spray coater, or the like can be used.

The drying temperature may be 50° C. or more and 130° C. or less, or 70° C. or more and 100° C. or less. Examples of the heat-curing conditions are not particularly limited, and for example, the film can be heat-cured in an oven at 140° C. or more and 200° C. or less for about 0.5 hours or more and 2 hours or less.

The molding film may contain an inorganic filler in an amount of 50% by weight or more and 90% by weight or less, 60% by weight or more and 80% by weight or less, or 70% by weight or more and 90% by weight or less, based on the total weight of the molding film.

On the other hand, the transmittance (measured at 550 nm) of the molding film may be 60% or more and 90% or less, or 70% or more and 85% or less. As the molding film has high transmittance in the above-mentioned range, the transparency is excellent, and the visibility can be improved when applied to a semiconductor package.

Further, the modulus (measured at 25° C.) of the molding film may be 10.0 GPa or more and 20.0 GPa or less, or 15.0 GPa or more and 20.0 GPa or less. As the molding film has a high modulus in the above-mentioned range, the durability of the semiconductor package can be improved based on high mechanical properties, when applied to a semiconductor package.

On the other hand, the average value of the coefficient of thermal expansion (CTE) of the molding film measured in a temperature range from 0° C. to 50° C. may be 1.00 ppm/K to 25.00 ppm/K, or 1.00 ppm/K to 8.00 ppm/K. As the molding film has a low coefficient of thermal expansion in the above-mentioned range, the difference in coefficient of thermal expansion between the semiconductor substrates is reduced when applied to a semiconductor package, and the durability of the semiconductor package can be improved, thus reducing the warpage characteristics of the semiconductor package.

The thickness of the molding film is not particularly limited, and for example, it is freely adjustable within the range of 0.01 μm or more and 1000 μm or less. When the thickness of the molding film increases or decreases by a certain value, the physical properties measured in the molding film can also be changed by a certain value. In the present invention, for example, the thickness used for measuring the physical properties of the molding film may be 95 μm or more and 105 μm or less, or 98 μm or more and 102 μm or less.

On the other hand, the molding film may include a cyclic aliphatic epoxy resin matrix, and an inorganic filler dispersed in the cyclic aliphatic epoxy resin, wherein the absolute value of the difference between the refractive index of the cyclic aliphatic epoxy resin matrix and the refractive index of the inorganic filler may be 0.1 or less, 0.01 or more and 0.1 or less, 0.05 or more and 0.1 or less, or 0.06 or more and 0.08 or less. Consequently, for the molding film, the refractive index of the cyclic aliphatic epoxy resin matrix and the refractive index of the inorganic filler have similar values in a state of the final cured product, and thus it is possible to have excellent optical performance and thus realize high transmittance.

The absolute value of the difference between the refractive index of the cyclic aliphatic epoxy resin matrix and the refractive index of the inorganic filler means the difference value obtained by subtracting a smaller value among the refractive index of the cycloaliphatic epoxy resin matrix and the refractive index of the inorganic filler from a larger value among the refractive index of the cycloaliphatic epoxy resin matrix and the refractive index of the inorganic filler.

When the absolute value of the difference between the refractive index of the cyclic aliphatic epoxy resin matrix and the refractive index of the inorganic filler satisfies 0.1 or less, as the refractive index of the cyclic aliphatic epoxy resin matrix and the refractive index of the inorganic filler have similar values, the transmittance (measured at 550 nm) may be 60% or more and 90% or less, or 70% or more and 85% or less. As the molding film has high transmittance in the above-mentioned range, the transparency is excellent and thus the visibility can be improved when applied to a semiconductor package.

On the other hand, when the absolute value of the difference between the refractive index of the cyclic aliphatic epoxy resin matrix and the refractive index of the inorganic filler in the molding film exceeds 0.1 and is excessively increased, as the refractive index of the cyclic aliphatic epoxy resin matrix and the refractive index of the inorganic filler are significantly different values, the transmittance (measured at 550 nm) decreases to less than 60% and transparency decreases. Thus, there is a problem that the visibility is poor when applied to a semiconductor package.

In particular, the absolute value of the difference between the refractive index of the cyclic aliphatic epoxy resin matrix and the refractive index of the inorganic filler having a similar value of 0.1 or less in the molding film is because the cyclic aliphatic epoxy resin not containing an unsaturated aliphatic group as the binder resin can be used to realize superior optical performance to that of a general epoxy resin.

Therefore, in the molding film, it is easy to match the refractive index of the cyclic aliphatic epoxy resin matrix with the refractive index of the silica filler itself used as the inorganic filler, and thus it is possible to realize uniformly high transmittance in the formed film.

The refractive index of the cyclic aliphatic epoxy resin matrix is 1.6 or less, 1.4 or more and 1.6 or less, 1.5 or more and 1.6 or less, 1.5 or more and 1.55 or less, or 1.51 or more and 1.53 or less. Further, the refractive index of the inorganic filler is 1.5 or less, 1.3 or more and 1.5 or less, 1.4 or more and 1.5 or less, 1.42 or more and 1.48 or less, or 1.44 or more and 1.46 or less.

The details of the inorganic filler contained in the molding film include those described above in the epoxy resin composition for molding a semiconductor of the one embodiment.

The cyclic aliphatic epoxy resin matrix includes a cyclic aliphatic epoxy resin containing a cyclic aliphatic functional group in a molecular structure or a cured product of the cyclic aliphatic epoxy resin. With respect to the cyclic aliphatic epoxy resin, all the contents described above for the polymer contained in the above-mentioned molding film can be equally applied.

In addition, the cyclic aliphatic epoxy resin matrix can be formed by photo-curing or heat-curing the epoxy resin composition for molding a semiconductor of the above-described one embodiment by light irradiation such as UV.

The cyclic aliphatic epoxy resin contained in the cyclic aliphatic epoxy resin matrix does not contain an unsaturated aliphatic functional group, unlike a typical epoxy resin, and thus it can have a refractive index which is very similar to the refractive index of the silica filler itself used as the inorganic filler, thereby realizing uniformly high transmittance in the molding film.

Therefore, the cyclic aliphatic epoxy resin matrix may include a cyclic aliphatic epoxy resin containing a repeating unit represented by Chemical Formula 3 and a repeating unit represented by Chemical Formula 4 or a cured product thereof. Further, the cyclic aliphatic epoxy resin may include a repeating unit represented by Chemical Formula 5. In addition, the cyclic aliphatic epoxy resin may include a repeating unit represented by Chemical Formula 6 having a structure in which the repeating unit represented by Chemical Formula 4 is crosslinked via the repeating unit represented by Chemical Formula 5.

The details of Chemical Formula 3, Chemical Formula 4, Chemical Formula 5, and Chemical Formula 6 include those described above for the polymer contained in the molding film.

The details of the production method, transmittance, modulus, thermal expansion coefficient, and thickness of the molding film including the cyclic aliphatic epoxy resin matrix; and the inorganic filler dispersed in the cyclic aliphatic epoxy resin, wherein the absolute value of the difference between the refractive index of the cyclic aliphatic epoxy resin matrix and the refractive index of the inorganic filler is 0.1 or less, are the same as those described above for the molding film including a polymer containing the repeating unit represented by Chemical Formula 3 and the repeating unit represented by Chemical Formula 4, and 50% by weight or more and 90% by weight or less of an inorganic filler dispersed in the polymer.

On the other hand, the cyclic aliphatic epoxy resin matrix may include a cyclic aliphatic epoxy resin containing a reaction product between the epoxy polymer represented by Chemical Formula 1 and the epoxy compound represented by Chemical Formula 2 in one embodiment, or a cured product thereof. The details of the epoxy polymer represented by Chemical Formula 1 and the epoxy compound represented by Chemical Formula 2 include those described above in the one embodiment.

The molding film may include 50% by weight or more and 90% by weight or less, 60% by weight or more and 80% by weight or less, or 70% by weight or more and 90% by weight or less of an inorganic filler, based on the total weight of the molding film.

3. Semiconductor Package

According to another embodiment of the present invention, a semiconductor package including the semiconductor sealed with the molding film of the other embodiment may be provided.

That is, the molding film of another embodiment may be used for sealing a semiconductor, and the semiconductor may include a circuit board and a semiconductor chip. The circuit board includes a printed circuit board (PCB), a semiconductor package substrate, a flexible semiconductor package (FPCB) substrate, or the like.

More specifically, the molding film of this alternative embodiment can be laminated on a semiconductor package substrate to seal the semiconductor chip or the circuit board mounted on the circuit board. Thereby, the semiconductor package can prevent the circuit board or the semiconductor chip from being exposed to the outside by the molding film, thereby realizing high reliability.

ADVANTAGEOUS EFFECTS

According to the present invention, an epoxy resin composition for molding a semiconductor having excellent heat resistance and mechanical properties and also having improved visibility while having a low coefficient of thermal expansion and thus exhibiting improved warpage characteristics, and a molding film and a semiconductor package using such an epoxy resin composition for molding a semiconductor, can be provided.

DETAILED DESCRIPTION OF THE EMBODIMENTS

Hereinafter, the function and effect of the present invention will be described in more detail by way of examples. However, these examples are given for illustrative purposes only, and the scope of the invention is not intended to be limited to or by these examples.

PREPARATION EXAMPLE AND COMPARATIVE EXAMPLE PREPARATION OF EPOXY RESIN

Preparation Example 1

A solid polymer represented by the following Chemical Formula A (weight average molecular weight: 1874 g/mol) and a liquid compound represented by the following Chemical Formula B [(3',4'-epoxycyclohexane)methyl 3,4-epoxycyclohexylcarboxylate (Daicel, Celloxide 2021P) were mixed in a weight ratio of 5:4 to prepare an epoxy resin.

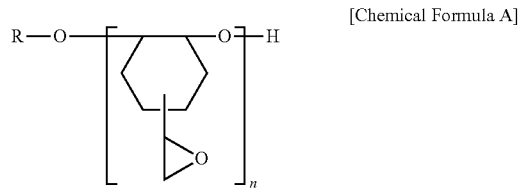

[Chemical Formula A]

In Chemical Formula A, R is a butyl group, and n is an integer of 15.

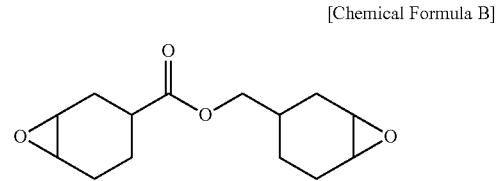 [SMILES: O=C(OCC1CCC2OC2C1)C1CCC2OC2C1]

[Chemical Formula B]

Preparation Example 2

An epoxy resin was prepared in the same manner as in Preparation Example 1, except that the weight ratio of the solid polymer represented by Chemical Formula A and a liquid compound represented by Chemical Formula B [(3', 4'-epoxycyclohexane)methyl 3,4-epoxycyclohexylcarboxylate (Daicel, Celloxide 2021P) was changed to 6:4.

Comparative Preparation Example 1

An epoxy resin was prepared by mixing 31 parts by weight of a bisphenol F type epoxy resin (product name: Epotohto YDF-8170 manufactured by Tohto Kasei, epoxy equivalent: 160) and 78.6 parts by weight of (3',4'-epoxycyclohexane)methyl 3,4-epoxycyclohexylcarboxylate (Daicel, Celloxide 2021P).

EXAMPLE AND COMPARATIVE EXAMPLE

Example 1

(1) Preparation of Epoxy Resin Composition for Molding Semiconductor

The respective components were mixed using 25 wt % of the epoxy resin obtained in Preparation Example 1 as a binder resin, 60 wt % of silica (average particle diameter of 5 μm) as a filler, 2 wt % of 2-phenylimidazole as a heat curing catalyst, 3 wt % of a leveling agent, and 10 wt % of MEK as a solvent, and the mixture was stirred and then dispersed with a three-roll mill device to prepare an epoxy resin composition for molding a semiconductor.

(2) Preparation of Molding Film/Semiconductor Package

A semiconductor package substrate on which a semiconductor chip was mounted was placed in a molding device containing a mold having a predetermined shape, and the epoxy resin composition for molding a semiconductor obtained above was supplied into the mold and then heated and cured 175° C. for 1 hour, thereby manufacturing a semiconductor package containing a molding film having a thickness of 100 μm/.

On the other hand, the semiconductor package substrate on which the semiconductor chip was mounted used that in which a copper clad laminate (CCL), LG-T-500GA, of LG Chem. Ltd. having thickness of 0.1 mm and a copper thickness of 12 μm was cut into a substrate of 5 cm in width and 5 cm in length and the semiconductor chip was mounted on the surface.

Also, a repeating unit structure represented by the following Chemical Formula C and Chemical Formula D was included in the molding film.

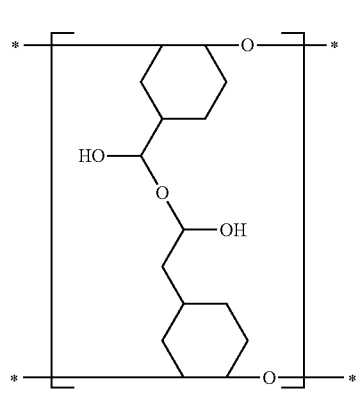

[Chemical Formula C]

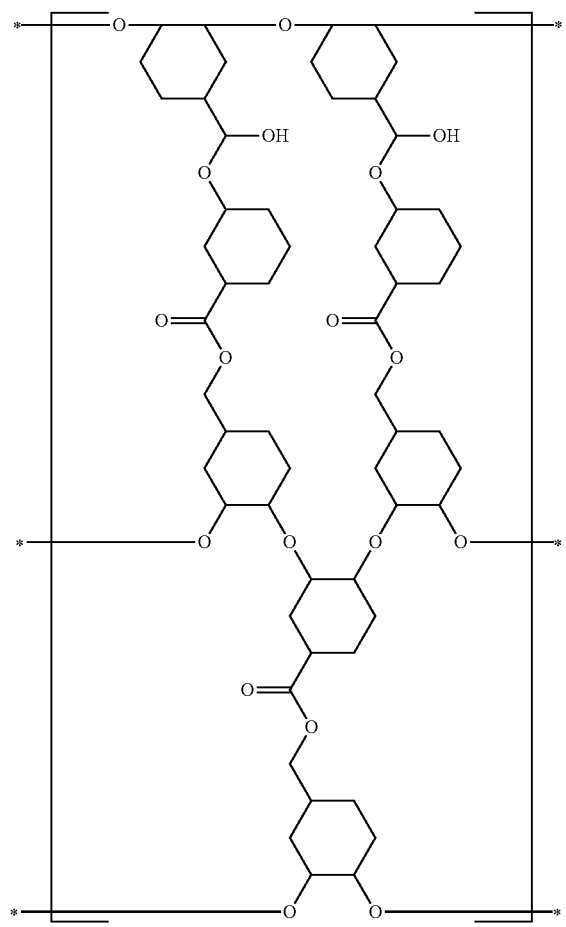

[Chemical Formula D]

Example 2

An epoxy resin composition for molding a semiconductor, a molding film, and a semiconductor package were prepared in the same manner as in Example 1, except that the epoxy resin obtained in Preparation Example 2 was used as a binder resin.

Example 3

The respective components were mixed using 13 wt % of the epoxy resin obtained in Preparation Example 1 as a binder resin, 80 wt % of silica (average particle diameter of 5 μm) as a filler, 1 wt % of 2-phenylimidazole as a heat curing catalyst, 1 wt % of a leveling agent, and 5 wt % of MEK as a solvent, and the mixture was stirred and then dispersed with a three-roll mill device to prepare an epoxy resin composition for molding a semiconductor. Subsequently, an epoxy resin composition for molding a semiconductor, a molding film, and a semiconductor package were prepared in the same manner as in Example 1.

Example 4

An epoxy resin composition for molding a semiconductor, a molding film, and a semiconductor package were prepared in the same manner as in Example 3, except that the epoxy resin obtained in Preparation Example 2 was used as a binder resin.

Comparative Example 1

An epoxy resin composition for molding a semiconductor, a molding film, and a semiconductor package were prepared in the same manner as in Example 1, except that the epoxy resin obtained in Comparative Preparation Example 1 was used as a binder resin.

Comparative Example 2

An epoxy resin composition for molding a semiconductor, a molding film, and a semiconductor package were prepared in the same manner as in Example 3, except that the epoxy resin obtained in Comparative Preparation Example 1 was used as a binder resin.

TEST EXAMPLE

1. Evaluation of Heat Resistance Reliability

The semiconductor package specimens obtained in Examples 1 to 4 and Comparative Examples 1 and 2 were allowed to stand in a pressure cooker test chamber at 146° C. and 100% RH for 14 hours, and then taken out to remove moisture on the surface. The test sample was made to float in a lead bath set at 288° C. with its film side facing upward. The appearance of the test sample was examined to determine whether the film was peeled or deformed, and the heat resistance reliability was evaluated.

OK: no bursting at 288° C. solder floating
NG: bursting at 288° C. solder floating 2. Evaluation of Modulus A molding film having a thickness of 100 μm obtained in Examples 1 to 4 and Comparative Examples 1 and 2 was cut into a width of 5.3 mm and a length of 17.2 to 17.9 mm to prepare a test specimen. Then, modulus was measured at a temperature from −20° C. to 300° C. at a heating rate of 10° C./min under the conditions of a frequency 1 Hz, Amplitude 5 μm and Measurement Static Force 0.1N using a TA800 DMA. The modulus values at room temperature (25° C.) are shown in Table 1 below.

3. Evaluation of Transparency

A mold film having a thickness of 100 μm obtained in Examples 1 to 4 and Comparative Examples 1 and 2 was cut into a width of 3 cm and a length of 3 cm to prepare a test specimen, and the transmittance was measured on a 550 nm basis using a UV-3600 Plus instrument from SHIMADZU.

4. Evaluation of Warpage Characteristics

A mold film having a thickness of 100 μm obtained in Examples 1 to 4 and Comparative Examples 1 and 2 was cut into a width of 4.8 mm and a length of 16 mm to prepare a test specimen, and then the coefficient of thermal expansion (CTE) was measured at a temperature of −20° C. to 300° C. at a heating rate of 5° C./min under a measurement static force of 0.1 N using TA's Q400EM. The average value of the coefficient of thermal expansion (CTE) measured in the temperature range from 0° C. to 50° C. was calculated and is shown in Table 1 below.

The measurement results of Experimental Examples 1 to 4 are shown in Table 1 below.

5. Evaluation of Refractive Index

With respect to the epoxy resin, which is a matrix of a molding film having a thickness of 100 μm obtained in Examples 1 to 4 and Comparative Examples 1 and 2, and the filler dispersed therein, the refractive index was respectively measured using a prism coupler manufactured by Sairon Technology. The results are shown in Table 2 below.

The measurement results of Experimental Example 5 are shown in Table 2 below.

TABLE 1

Measurement results of Experimental Examples 1 to 4

| Category | Heat resistance reliability | Modulus (GPa) | Transmittance (%) | CTE (ppm/K) |
| --- | --- | --- | --- | --- |
| Example 1 | OK | 10.1 | 83.23 | 23.21 |
| Example 2 | OK | 11.0 | 76.65 | 21.35 |
| Example 3 | OK | 17.0 | 81.47 | 5.68 |
| Example 4 | OK | 18.5 | 72.55 | 4.62 |
| Comparative Example 1 | OK | 7.5 | 59.11 | 30.36 |
| Comparative Example 2 | OK | 13.0 | 49.13 | 10.78 |

As shown in Table 1, it can be confirmed that the molding films of Examples 1 to 4 obtained from a composition containing 60 wt % or more and 80 wt % or less of silica filler together with the epoxy resin synthesized in Preparation Example 1 or Preparation Example 2 exhibited high transmittance of 72.55% to 83.23% at 550 nm, and thus the transparency was greatly improved.

On the other hand, the molding films of Comparative Examples 1 and 2 obtained from a composition containing 60 wt % or more and 80 wt % or less of silica filler together with the epoxy resin synthesized in Comparative Preparation Example 1 exhibited transmittance of 49.13% to 59.11% at 550 nm, which is significantly lower than that of Example 1, confirming that transparency was poor.

As described above, it was confirmed that the molding films of Examples 1 to 4 exhibited significantly improved properties in terms of the transparency than the molding films of Comparative Examples 1 and 2 and also had excellent mechanical properties according to a high modulus of a level equal to or higher than that of the comparative examples, and had excellent warpage characteristics according to a low coefficient of thermal expansion.

In particular, the molding films of Examples 3 and 4 obtained from the composition containing 80 wt % of silica filler together with the epoxy resin synthesized in Preparation Example 1 or Preparation Example 2 exhibited a coefficient of thermal expansion (CTE) of 4.62 ppm/K to 5.68 ppm/K, which is significantly lower than that of the comparative examples, while having a modulus of 17.0 GPa to 18.5 GPa which is significantly higher than that of the comparative examples, confirming the improvement of the effect due to the increase of the content of silica filler.

TABLE 2

Measurement results of Experimental Example 5

| Category | Refractive index of epoxy resin matrix | Refractive index of filler | Absolute value of difference between refractive index of epoxy resin matrix and refractive index of inorganic filler |
| --- | --- | --- | --- |
| Example 1 | 1.51 | 1.45 | 0.06 |
| Example 2 | 1.53 | 1.45 | 0.08 |
| Example 3 | 1.51 | 1.45 | 0.06 |

TABLE 2-continued

Measurement results of Experimental Example 5

| Category | Refractive index of epoxy resin matrix | Refractive index of filler | Absolute value of difference between refractive index of epoxy resin matrix and refractive index of inorganic filler |
|---|---|---|---|
| Example 4 | 1.53 | 1.45 | 0.08 |
| Comparative Example 1 | 1.62 | 1.45 | 0.17 |
| Comparative Example 2 | 1.62 | 1.45 | 0.17 |

As shown in Table 2, it was confirmed that in the molding films of Examples 1 to 4, the absolute value of the difference between the refractive index of the epoxy resin matrix and the refractive index of the inorganic filler was as small as 0.06 to 0.08, and the epoxy resin matrix and the inorganic filler had almost the same refractive index.

On the other hand, in the molding films of Comparative Examples 1 and 2, the absolute value of the difference between the refractive index of the epoxy resin matrix and the refractive index of the inorganic filler was 0.17, which is greatly increased as compared with the examples, confirming that the refractive indexes of the epoxy resin matrix and the inorganic filler are different from each other.

As described above, the molding films of Examples 1 to 4 could uniformly achieve high transmittance in the molding film by adjusting the refractive index of the epoxy resin matrix and the refractive index of the inorganic filler to a similar level.

The invention claimed is:

1. A molding film comprising: a cyclic aliphatic epoxy resin matrix; and an inorganic filler dispersed in the cyclic aliphatic epoxy resin matrix, wherein an absolute value of the difference between a refractive index of the cyclic aliphatic epoxy resin matrix and a refractive index of the inorganic filler is 0.1 or less, wherein the cyclic aliphatic epoxy resin matrix includes a cyclic aliphatic epoxy resin containing a reaction product between an epoxy structure represented by the following Chemical Formula 1 and an epoxy compound represented by the following Chemical Formula 2:

[Chemical Formula 1]

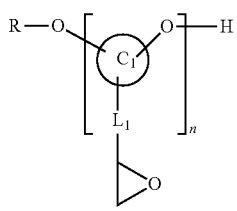

wherein, in the Chemical Formula 1, R is an alkyl group having 1 to 20 carbon atoms or a cycloalkyl group having 3 to 20 carbon atoms, n is an integer from 1 to 30, $C_1$ is a cycloalkane having 3 to 10 carbon atoms, and $L_1$ is a direct bond or an alkylene group having 1 to 10 carbon atoms,

[Chemical Formula 2]

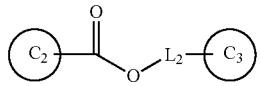

wherein, in the Chemical Formula 2, $C_2$ to $C_3$ are each independently a cycloalkane having 3 to 10 carbon atoms to which an epoxy group is bonded, and $L_2$ is a direct bond or an alkylene group having 1 to 10 carbon atoms, and wherein the epoxy compound is in an amount of 50 parts by weight or more and 90 parts by weight or less, based on 100 parts by weight of the epoxy structure represented by the Chemical Formula 1.

2. The molding film of claim 1, having a transmittance as measured at 550 nm of 60% or more and 90% or less.

3. The molding film of claim 1, wherein the cyclic aliphatic epoxy resin matrix includes a cyclic aliphatic epoxy resin containing a repeating unit represented by the Chemical Formula 3 and a repeating unit represented by the Chemical Formula 4, or a cured product thereof:

[Chemical Formula 3]

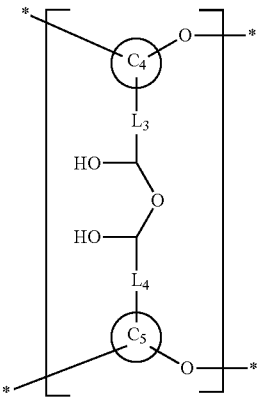

[Chemical Formula 4]

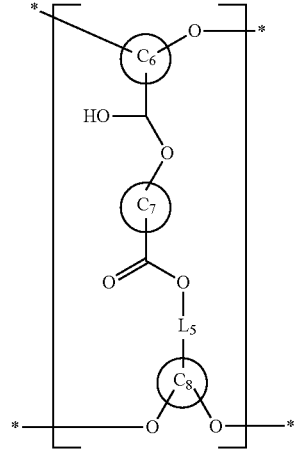

wherein, in the Chemical Formulae 3 and 4, $C_4$ to $C_8$ are each independently a cycloalkane having 3 to 10 carbon atoms, and $L_3$ to $L_5$ are each independently a direct bond or an alkylene group having 1 to 10 carbon atoms.

4. The molding film of claim 1, wherein the content of the inorganic filler dispersed in the cyclic aliphatic epoxy resin matrix is 50% by weight or more and 90% by weight or less based on a total weight of the molding film.

* * * * *